(12) United States Patent
Quintero Pérez et al.

(10) Patent No.: US 12,156,482 B2
(45) Date of Patent: Nov. 26, 2024

(54) SEMICONDUCTOR-SUPERCONDUCTOR HYBRID DEVICE AND FABRICATION THEREOF

(71) Applicant: Microsoft Technology Licensing, LLC, Redmond, WA (US)

(72) Inventors: Marina Quintero Pérez, Delft (NL); Grzegorz Piotr Mazur, Warsaw (PL); Nick Van Loo, Delft (NL)

(73) Assignee: Microsoft Technology Licensing, LLC, Redmond, WA (US)

( * ) Notice: Subject to any disclaimer, the term of this patent is extended or adjusted under 35 U.S.C. 154(b) by 143 days.

(21) Appl. No.: 17/904,798

(22) PCT Filed: Feb. 28, 2020

(86) PCT No.: PCT/EP2020/055356
§ 371 (c)(1),
(2) Date: Aug. 23, 2022

(87) PCT Pub. No.: WO2021/170252
PCT Pub. Date: Sep. 2, 2021

(65) Prior Publication Data
US 2023/0128554 A1   Apr. 27, 2023

(51) Int. Cl.
*H10N 60/85* (2023.01)
*H10N 60/01* (2023.01)
*H10N 60/20* (2023.01)

(52) U.S. Cl.
CPC ............ *H10N 60/85* (2023.02); *H10N 60/01* (2023.02); *H10N 60/205* (2023.02)

(58) Field of Classification Search
CPC .............................. H10N 60/01; H10N 60/85
See application file for complete search history.

(56) References Cited

U.S. PATENT DOCUMENTS

| | | | |
|---|---|---|---|
| 10,692,010 | B2 | 6/2020 | Freedman et al. |
| 10,879,464 | B2 | 12/2020 | Krogstrup Jeppesen et al. |

(Continued)

FOREIGN PATENT DOCUMENTS

| | | |
|---|---|---|
| WO | 2019099171 A2 | 5/2019 |
| WO | 2020167318 A1 | 8/2020 |
| WO | 2021110274 A1 | 6/2021 |

OTHER PUBLICATIONS

"Type 1 Superconductors", Retrieved from: http://www.superconductors.org/Type1.htm, Retrieved Date: Apr. 20, 2020, 03 Pages.

(Continued)

*Primary Examiner* — Jae Lee
(74) *Attorney, Agent, or Firm* — Alleman Hall & Tuttle LLP (57) ABSTRACT

A semiconductor-superconductor hybrid device comprises a semiconductor component and a superconductor component arranged over the semiconductor component. The superconductor component comprises a continuous portion of a superconductor material and a discontinuous portion of a non-ferromagnetic metal. The discontinuous portion is configured to increase the critical field of the superconductor component. It has been found that providing a superconductor component with a discontinuous portion of non-ferromagnetic metal may increase the critical field of the superconductor component, allowing the device to be operated in a stronger magnetic field. Further aspects provide a method of fabricating the device, and the use of a non-ferromagnetic metal to increase the critical field of a superconductor component of a semiconductor-superconductor hybrid device.

19 Claims, 5 Drawing Sheets

(56) References Cited

U.S. PATENT DOCUMENTS

| | | |
|---|---|---|
| 11,201,273 B2 | 12/2021 | Pikulin et al. |
| 2008/0188372 A1 | 8/2008 | Motowidlo |
| 2021/0126181 A1 | 4/2021 | Winkler et al. |
| 2021/0151575 A1* | 5/2021 | Holmes .............. H10N 60/0912 |

OTHER PUBLICATIONS

Dinner, et al., "Depairing Critical Current Achieved in Superconducting Thin Films with through-thickness Arrays of Artificial pinning Centers", In Repository of arXiv:1011.4599v2, Feb. 25, 2011, 9 Pages.

Horide, et al., "Vortex Pinning by Gold Nanorods in GdBa2Cu3O7-σ Thin Films", In Journal of IEEE Transactions on Applied Superconductivity vol. 17, Issue 2, Jun. 2007, pp. 3729-3732.

Kim, et al., "Flux Pinning by the InAs Nanorods in Nb Thin Films", In Journal of IEEE Transactions on Applied Superconductivity vol. 28, Issue 4, Jun. 2018, 5 Pages.

"International Search Report and Written Opinion Issued in PCT Application No. PCT/EP2020/055356", Mailed Date: Nov. 19, 2020, 13 Pages.

U.S. Appl. No. 17/904,794, filed Feb. 28, 2020.

\* cited by examiner

SEMICONDUCTOR-SUPERCONDUCTOR HYBRID DEVICE AND FABRICATION THEREOF

CROSS REFERENCE TO RELATED APPLICATIONS

The present application is a U.S. National Phase of International Patent Application Serial No. PCT/EP2020/055356 entitled "SEMICONDUCTOR-SUPERCONDUCTOR HYBRID DEVICE AND FABRICATION THEREOF", filed Feb. 28, 2020.

BACKGROUND

Topological quantum computing is based on the phenomenon whereby non-abelian anyons, in the form of "*Majorana* zero modes" (MZMs), can be formed in regions where a semiconductor is coupled to a superconductor. A non-abelian anyon is a type of quasiparticle, meaning not a particle per se, but an excitation in an electron liquid that behaves at least partially like a particle. An MZM is a particular bound state of such quasiparticles. Under certain conditions, these states can be formed close to the semiconductor-superconductor interface in a nanowire formed from a length of semiconductor coated with a superconductor. When MZMs are induced in the nanowire, it is said to be in the "topological regime". To induce this requires a magnetic field, conventionally applied externally, and also cooling of the nanowire to a temperature that induces superconducting behaviour in the superconductor material. It may also involve gating a part of the nanowire with an electrostatic potential.

By forming a network of such nanowires and inducing the topological regime in parts of the network, it is possible to create a quantum bit (qubit) which can be manipulated for the purpose of quantum computing. A quantum bit, or qubit, is an element upon which a measurement with two possible outcomes can be performed, but which at any given time (when not being measured) can in fact be in a quantum superposition of the two states corresponding to the different outcomes.

To induce an MZM, the device is cooled to a temperature where the superconductor (e.g. Aluminium, Al) exhibits superconducting behaviour. The superconductor causes a proximity effect in the adjacent semiconductor, whereby a region of the semiconductor near the interface with the superconductor also exhibits superconducting properties. I.e. a topological phase behaviour is induced in the adjacent semiconductor as well as the superconductor. It is in this region of the semiconductor where the MZMs are formed.

Another condition for inducing the topological phase where MZMs can form is the application of a magnetic field in order to lift the spin degeneracy in the semiconductor. Spin degeneracy refers to the case where different spin states have the same energy level. Spin degeneracy can be lifted by means of a magnetic field, causing an energy level spilt between the differently spin-polarized electrons. This is known as the Zeeman effect. Typically the magnetic field is applied by an external electromagnet. However, U.S. Ser. No. 16/246,287 has also disclosed a heterostructure in which a layer ferromagnetic insulator is disposed between the superconductor and semiconductor in order to internally apply the magnetic field for lifting the spin degeneracy, without the need for an external magnet. Examples given for the ferromagnetic insulator included the compounds: EuS, GdN, $Y_3Fe_5O_{12}$, $Bi_3Fe_5O_{12}$, $YFeO_3$, $Fe_2O_3$, $Fe_3O_4$, GdN, $Sr_2CrReO_6$, $CrBr_3/CrI_3$, $YTiO_3$.

Inducing MZMs typically also requires gating the nanowire with an electrostatic potential. However, U.S. Ser. No. 16/120,433 has also disclosed a structure which is capable of exhibiting topological behaviour including MZMs without the need for gating. In this case the nanowires have a full-shell of superconductor all the way around the perimeter of the nanowire, which obviates the need for gating.

Figure 1:
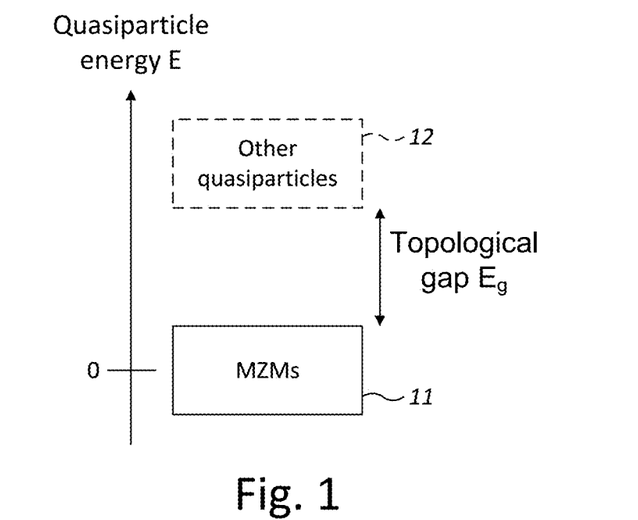
FIG. 1 is an energy level diagram illustrating the concept of a topological gap.

As illustrated in FIG. 1, in order to create good quality devices in which the MZMs are long-lived, it is preferable to have a large topological gap $E_g$. A material in the topological phase (whether a superconductor or a region of proximity-induced superconductivity in a semiconductor) exhibits distinct energy bands: a lower band 11 and an upper band 12. The lower band 11 is a band where the quasiparticle energy E falls in a lower range, and the upper band (or "excitation band") 12 is a band of higher quasiparticle energy. The topological gap $E_g$ is an energy window between the upper and lower bands 11, 12 where no quasiparticles can exist due to the quantized (discrete) nature of the quasiparticle energy levels. The lower band 11, upper band 12 and topological gap $E_g$ are analogous to the valence band, conduction band and band gap for electrons in a semiconductor. In the upper, excitation, band 12 the quasiparticles can propagate freely through the superconductor (or proximity-induced region in a semiconductor), analogous to the electrons in the conductance band in a semiconductor.

The Majoranas, whose states form the MZMs, form the lower band 11. The Majoranas are part of the computational space, i.e. the properties of the system being exploited for the quantum computing application in question. In other words, the MZMs are the operating elements of the qubit. On the other hand, the particle-like excitations (quasiparticles) in the upper band 12 are not part of the computational space. If these quasiparticles cross the topological energy gap $E_g$ into the lower band 11 due to thermal fluctuations, then they will destroy at least some of the MZMs. This is sometimes referred to as "poisoning" the MZMs. The gap $E_g$ provides protection for the MZMs against such poisoning. The probability of a quasiparticle existing in the upper band and crossing the gap Eg from the upper to the lower band is proportional to $e^{-E_g/T}$ where T is temperature converted to energy using the Boltzmann constant. Hence the larger the topological gap, the more protection is afforded to the MZMs against poisoning from the harmful quasiparticles in the upper band 12.

SUMMARY

In one aspect, there is provided a semiconductor-superconductor hybrid device comprising a semiconductor component; and a superconductor component arranged over the semiconductor component. The superconductor component comprises a continuous portion of a superconductor material and a discontinuous portion of a non-ferromagnetic metal. The discontinuous portion is configured to increase the critical field of the superconductor component.

In another aspect, there is provided a method of fabricating a semiconductor-superconductor hybrid device. The method comprises fabricating a semiconductor component and fabricating a superconductor component over the semiconductor component. The superconductor component comprises a continuous portion of a superconductor material and a discontinuous portion of a non-ferromagnetic metal. The discontinuous portion is configured to increase the critical field of the superconductor component.

A still further aspect provides the use of a non-ferromagnetic metal to increase the critical field of a superconductor component of a semiconductor-superconductor hybrid device, wherein the non-ferromagnetic metal is present in the superconductor component in the form of a discontinuous portion arranged on or in a continuous portion of a superconductor material.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Nor is the claimed subject matter limited to implementations that solve any or all of the disadvantages noted herein.

BRIEF DESCRIPTION OF THE DRAWINGS

To assist understanding of embodiments of the present disclosure and to show how such embodiments may be put into effect, reference is made, by way of example only, to the accompanying drawings in which:

FIG. 2b is a simplified schematic cross-section of the illustrative semiconductor-superconductor hybrid device along line X-X of FIG. 2a;

FIGS. 2 to 5 are schematic, and are not to scale. The relative proportions of components shown in these FIGS. may be exaggerated for ease of representation.

DETAILED DESCRIPTION OF EMBODIMENTS

As used herein, the verb 'to comprise' is used as shorthand for 'to include or to consist of'. In other words, although the verb 'to comprise' is intended to be an open term, the replacement of this term with the closed term 'to consist of' is explicitly contemplated, particularly where used in connection with chemical compositions.

Directional terms such as "top", "bottom", "left", "right", "above", "below", "horizontal" and "vertical" are used herein for convenience of description and relate to the semiconductor-superconductor hybrid device in the orientation shown in FIG. 2b. For the avoidance of any doubt, this terminology is not intended to limit the orientation of the device in an external frame of reference.

As used herein, the term "superconductor" refers to a material which becomes superconductive when cooled to a temperature below a critical temperature, Tc, of the material. The use of this term is not intended to limit the temperature of the device.

A "nanowire" is an elongate member having a nano-scale width, and a length-to-width ratio of at least 100, or at least 500, or at least 1000. A typical example of a nanowire has a width in the range 10 to 500 nm, optionally 50 to 100 nm or 75 to 125 nm. Lengths are typically of the order of micrometres, e.g. at least 1 µm, or at least 10 µm.

A "thin film thickness monitor" is a device which is configured to measure the thickness of a layer of material during a deposition process. A thin film thickness monitor may include, for example, a quartz crystal microbalance as a sensor. Optical measurements are also possible. A "deposition rate controller" is a thin film thickness monitor which is further configured to control at least one aspect of the deposition process, for example to stop the deposition process once a predetermined layer thickness is reached.

A "nominal thickness" is a thickness as measured using a thin film thickness monitor. A thin film thickness monitor may return a layer thickness which is less than the thickness of a monolayer, indicating that an incomplete layer has been formed.

A "directional deposition process" is a process that uses a directed beam of material or a precursor of the material to deposit material on a surface. In a directional deposition process, the position at which material is adsorbed onto the surface is determined by the direction of the beam. The beam has a constant azimuth relative to the surface, or in other words, the direction of the beam relative to the surface is fixed during the deposition. Examples of processes which may be used to achieve directional deposition include molecular beam epitaxy, thermal evaporation, and electron beam evaporation.

The term "coupling" in the context of the present disclosure refers to the hybridisation of energy levels.

A "semiconductor-superconductor hybrid device" comprises a semiconductor component and a superconductor component which may become coupled to one another under certain operating conditions. In particular, this term refers to a structure capable of showing topological behaviour such as *Majorana* zero modes, or other excitations useful for quantum computing applications. The operating conditions generally comprise cooling the structure to a temperature below the Tc of the superconductor component, applying a magnetic field to the structure, and applying electrostatic gating to the structure. Generally, at least part of the semiconductor component is in intimate contact with the superconductor component, for example the superconductor component may be epitaxially grown on the semiconductor component. Certain device structures having one or more further components between the semiconductor component and superconductor component have however been proposed.

The content of all documents cited herein is hereby incorporated by reference in its entirety.

Inducing topological behaviour in a semiconductor-superconductor hybrid device typically involves, amongst other things, applying a magnetic field to the device. A superconductor material which is in a superconductive state exhibits perfect diamagnetism, and excludes the magnetic field. Applying a magnetic field having a field strength which exceeds a threshold, referred to as the critical field, causes the superconductor material to undergo a transition from the superconductive state to a normal conductive state. In other words, the superconductive behaviour is lost if the applied magnetic field is too strong. Loss of the superconductive behaviour prevents topological behaviour from being observed. It would be desirable to provide a superconductor-semiconductor hybrid device which can be operated in stronger magnetic fields, because this may allow a larger topological gap to be achieved. Critical field can vary depending on the thickness of a layer of superconductor material, with thicker layers having lower critical field. Increasing the critical field of the superconductor component may also allow for the use of thicker superconductor layers, which may simplify fabrication.

Figure 2A:
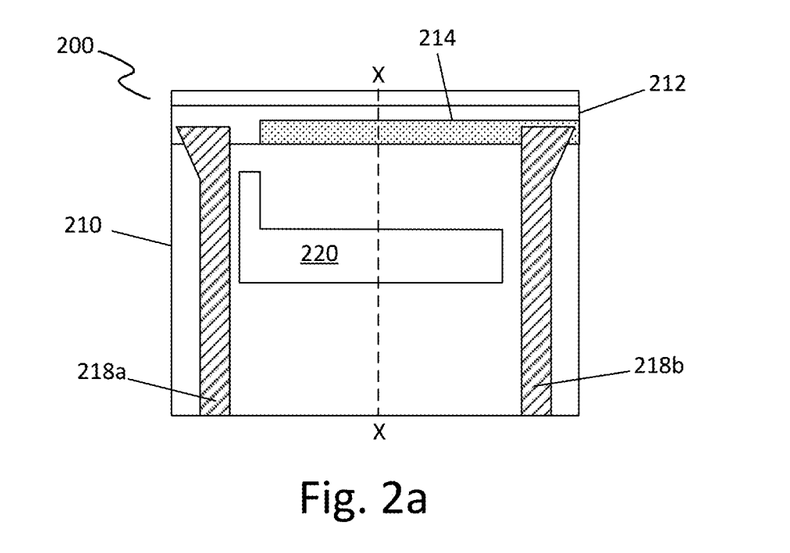
FIG. 2a is a simplified schematic plan view of an illustrative semiconductor-superconductor hybrid device.

An example of a semiconductor-superconductor hybrid device 200 will now be described with reference to FIGS. 2a and 2b simultaneously. FIG. 2a shows a simplified schematic plan view of the device, and FIG. 2b shows a simplified schematic cross-section along line X-X of FIG. 2a.

Device 200 includes a substrate 210. The substrate 210 provides a base on which further components are fabricated, and typically comprise a wafer of a crystalline material. Examples of materials useful as wafers include silicon, indium phosphide and gallium arsenide.

The device further includes a semiconductor component 212 in the form of a nanowire, and a superconductor component 214 in the form of a layer arranged on the semiconductor component 212. Electrical contacts 218a, 218b are arranged at respective ends of the semiconductor component 212.

Operating a semiconductor-superconductor hybrid device involves gating the device, or in other words applying an electrostatic field to the semiconductor component of the device. As shown in FIG. 2b, the device 200 includes a gate electrode 216 arranged on a portion of the substrate 210.

The example device 200 is bottom-gated, in other words, the gate electrode 216 is arranged underneath the semiconductor component 212. Various other gate electrode configurations are possible. The form of gate electrode 216 is not particularly limited. Gate electrode 216 may comprise a metal such as gold, platinum, tungsten, or palladium.

A dielectric layer 217 covers the substrate 210 and gate electrode 216. The dielectric layer 217 may comprise any suitable material, for example aluminium oxide, a silicon oxide, or a silicon nitride. Dielectric layer 217 serves as a gate dielectric for preventing a flow of current between the gate electrode 216 and the remaining components of the device.

A semiconductor component 212 is arranged on the dielectric layer 217, and over the gate electrode 216. Semiconductor component 212 of this example is in the form of a nanowire. The illustrated nanowire has a generally hexagonal cross-section, with six facets. However, the cross-sectional shape of the nanowire is not particularly limited.

The semiconductor component 212 may comprise a III-V, IV-VI or II-VI semiconductor material. Examples of III-V a material of Formula 1:

$$InAs_xSb_{(1-x)} \quad \text{(Formula 1)}$$

where x is in the range 0 to 1. In other words, the semiconductor component 112 may comprise indium antimonide (x=0), indium arsenide (x=1), or a ternary mixture comprising 50% indium on a molar basis and variable proportions of arsenic and antimony (0<x<1). Materials in this class may have good compatibility with superconductor materials such as aluminium. Values of x in the range 0.35 to 0.8 may provide particular advantages for some implementations.

Examples of IV-VI semiconductors include those of Formula 2:

$$Pb_{(1-y)}Sn_yTe \quad \text{(Formula 2)}$$

wherein y is in the range 0 to 1. Examples of materials in this class include lead telluride (y=0) and tin telluride (y=1). Varying y may vary the band gap of the semiconductor.

Further examples of IV-VI semiconductors include those of Formula 3:

$$Pb_{(1-a)}Sn_aSe \quad \text{(Formula 3)}$$

wherein a is in the range 0 to 1. Examples of materials in this class include lead selenide (a=0) and tin selenide (a=1).

A still further class of illustrative semiconductors is those of Formula 4:

$$Hg_{(1-b)}CdbTe \quad \text{(Formula 4)}$$

where b is in the range 0 to 1.

Lead, tin and mercury chalcogenides, e.g. semiconductors of formula 2, 3 and 4, may provide high spin-orbit coupling and large g-factors.

A superconductor component 214 is arranged on the semiconductor component 212. The semiconductor component 212 and superconductor component 214 are configured to allow coupling of the semiconductor component 212 and superconductor component 214. Such coupling allows excitations useful for quantum computing to be induced under certain conditions.

In this example, superconductor component 214 is in direct contact with the semiconductor component 212. For example, superconductor component 214 may be grown epitaxially on the semiconductor component 212. However, direct contact is not necessarily essential to achieve coupling. Device structures in which a further component, such as a ferromagnetic insulator, may be arranged between the semiconductor component 212 and superconductor component 214 have been proposed).

Figure 2B:
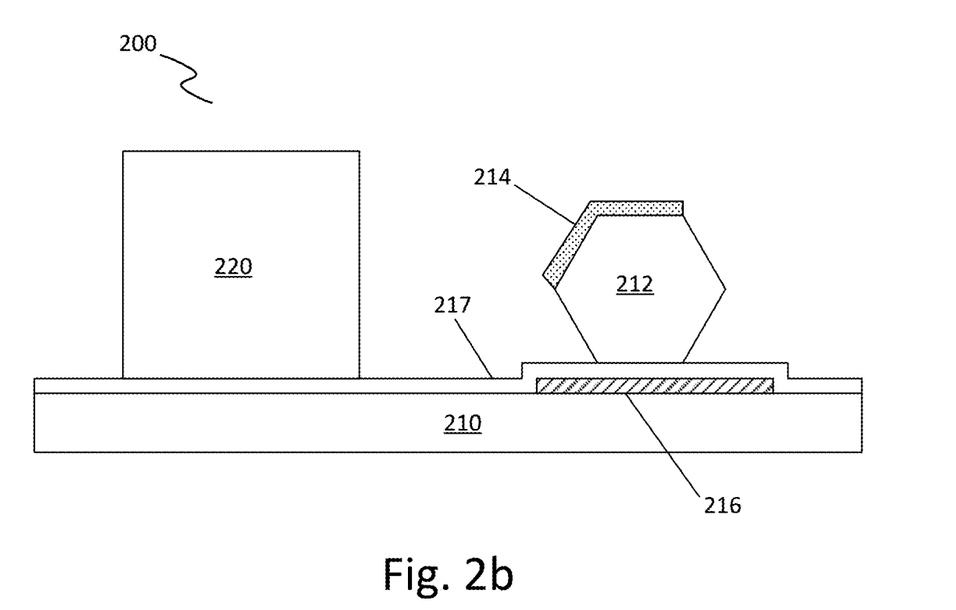

FIG. 2b further shows electrical connectors 218a, 218b provided at respective ends of the semiconductor component 212. The electrical connectors 218 allow for connection to other devices. For example, it may be desired to measure current through the nanowire and/or voltage across the nanowire. The form of electrical connector 218 is not particularly limited. Electrical connector 218 may be formed from a normal conductor, such as gold.

FIGS. 2a and 2b further show a shadow wall 220. The shadow wall 220 is arranged on the dielectric layer 217 and is spaced laterally from the semiconductor component 212 and superconductor component 214. The shadow wall 220 does not influence the operation of the device, but may be useful during fabrication.

A shadow wall is a structure which is configured to control the deposition of a material during a directional deposition process. A shadow wall blocks a beam of material, thereby creating a shadow region in which the material is not deposited. In this example, shadow wall 220 is in the form of a block of dielectric material arranged on the dielectric layer 217. Examples of materials useful for fabricating shadow walls include silicon oxides and silicon nitrides. Shadow wall structures are described in further detail in WO2019/099171 A2. An example of a fabrication method which makes use of shadow walls is described in PCT/US2019/18284.

Arranging the gate electrode as a bottom gate and using shadow walls to control deposition of the superconductor component may allow deposition of the superconductor component to be the final step performed during fabrication of the device. It may be advantageous to minimise the amount of processing which is performed after forming the semiconductor-superconductor interface, to avoid degrading the interface.

An optional capping layer of a dielectric material, such as aluminium oxide, may cover the device 200.

Various modifications to the device structure illustrated in FIG. 2 are possible.

Shadow wall 220 is optional. Even in implementations where a shadow wall is used during fabrication, the shadow wall may be removed after use and does not necessarily remain in the finished device.

The device shown in FIGS. 2a and 2b is bottom-gated. Other gate electrode configurations are possible, and certain implementations do not include a gate electrode. In a top-gated device, a layer of dielectric material covers the semiconductor-superconductor hybrid structure, and a gate electrode is arranged on top of the dielectric layer, over the hybrid structure. In a side-gated device, the gate electrode is spaced laterally from the hybrid structure. An empty space may act as the gate dielectric in a side-gated configuration.

In a side- or top-gated device, the semiconductor component may be grown epitaxially directly on the substrate, rather than being spaced from the substrate by a dielectric layer 217 as shown in FIG. 2b.

In a comparative semiconductor-superconductor hybrid device, the superconductor component is typically in the form of a layer of superconductor material. The present inventors have found that by adding a discontinuous portion of a non-ferromagnetic metal to the superconductor component a semiconductor-superconductor hybrid device which may be operable in a stronger applied magnetic field may be obtained.

Without wishing to be bound by theory, it is believed that adding a discontinuous portion of a non-ferromagnetic metal may increase the increase the spin-orbit scattering rate. Spin-orbit scattering prevents Cooper pairs, i.e. pairs of electrons which are present in a material in a superconductive state, from breaking. In other words, the discontinuous portion of non-ferromagnetic metal may lift the Pauli limit. As a consequence, a stronger magnetic field may be applied in-plane without loss of the superconductive behaviour.

A discontinuous portion may comprise a plurality of isolated particles of the non-ferromagnetic metal embedded on or in the continuous portion of the superconductor material. In other words, there may be "islands" of non-ferromagnetic metal embedded on or in a "sea" of superconductor material.

The continuous portion and discontinuous portion do not represent an alloy or chemical compound. Instead, the continuous and discontinuous portions may be in the form of a physical mixture. Alternatively, the discontinuous portion may be a partial layer at a surface of the continuous portion. The discontinuous portion may be on the surface of the continuous portion, or embedded in the surface of the continuous portion.

The physical forms of the continuous and discontinuous portions will now be further explained with reference to FIGS. 3 to 5. These FIGS. each show schematic cross-sections of semiconductor-superconductor hybrid structures.

Figure 3:
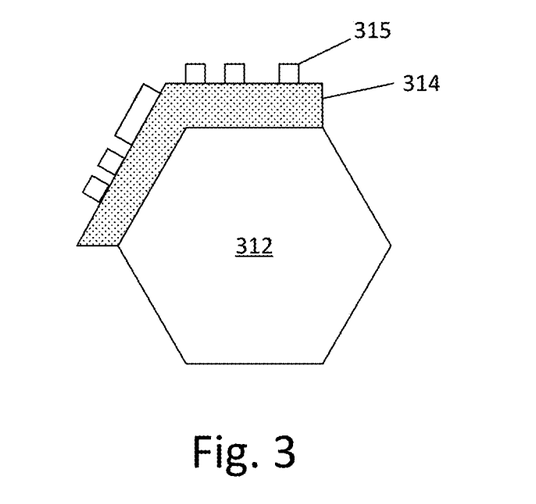
FIG. 3 is a schematic cross-section of a first example of a semiconductor-superconductor hybrid structure.
Figure 4:
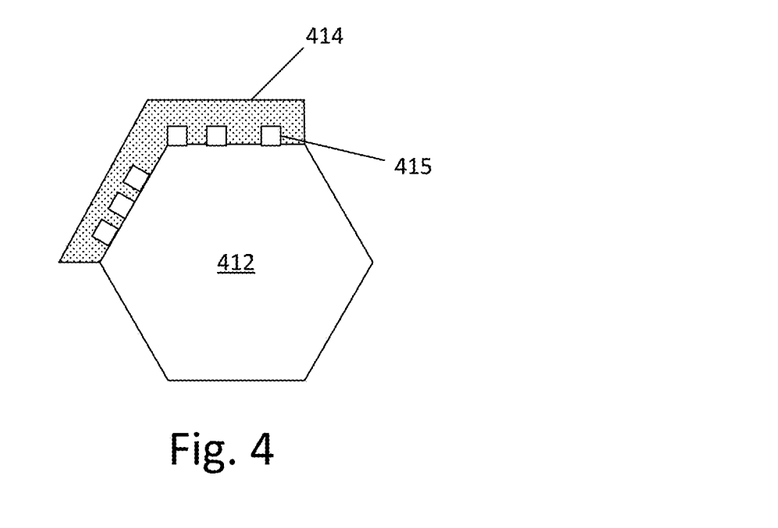
FIG. 4 is a schematic cross-section of a second example of a semiconductor-superconductor hybrid structure.

For example, as illustrated in FIG. 3, the discontinuous portion 315 may be at a surface of the continuous portion 314. This may be achieved by fabricating the discontinuous portion and the continuous portion in discrete steps. To obtain a structure as illustrated in FIG. 3, a continuous portion of superconductor material 314 may first be deposited on a semiconductor component 312, and then a discontinuous portion of non-ferromagnetic metal 315 may be deposited over the continuous portion 314.

A discontinuous portion may be in the form of an incomplete layer of the non-ferromagnetic metal. In other words, the discontinuous portion may be a layer which is less than a complete monolayer of the metal. The nominal thickness of a layer may be monitored during its fabrication. Devices for monitoring layer thicknesses are referred to in the art as thin-film thickness monitors or deposition rate controllers. An incomplete layer is obtainable by stopping deposition of the metal before the nominal thickness reaches the thickness of a monolayer. For example, deposition may be stopped after the nominal thickness reaches 20% to 80% of the thickness of a monolayer of the metal.

The order in which the continuous portion and discontinuous portion may be selected as desired. For example, as shown in FIG. 4, a discontinuous portion 415 may be deposited on the semiconductor component 412, and a continuous portion 414 of superconductor material may be deposited over the discontinuous portion 415.

In another variant, the superconductor component comprises a sandwich structure in which a discontinuous portion of non-ferromagnetic metal is arranged between two continuous portions of superconductor material. A sandwich structure is obtainable by depositing a first continuous portion of superconductor material on a semiconductor component, depositing a discontinuous portion of non-ferromagnetic metal on the first continuous portion, and depositing a second continuous portion of superconductor material over the discontinuous portion.

Figure 5:
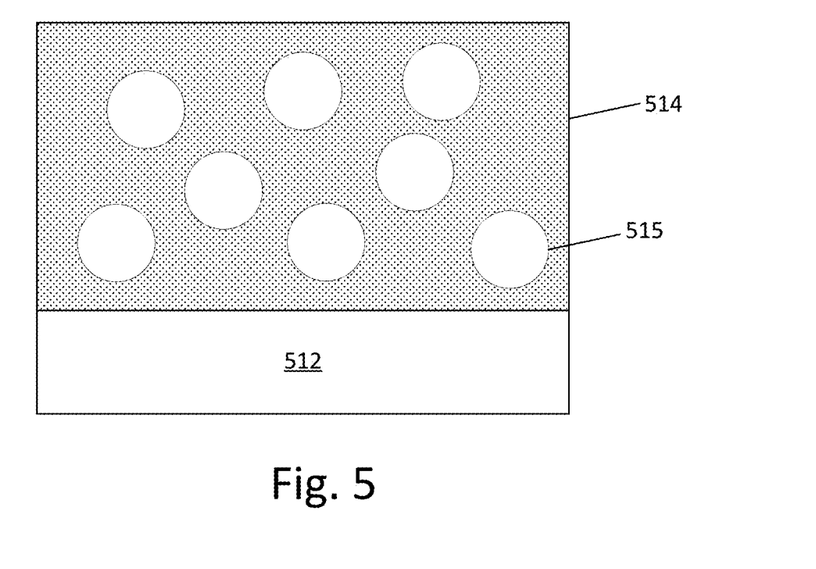
FIG. 5 is a schematic cross-section of a third example of a semiconductor-superconductor hybrid structure.

A still further possibility, illustrated in FIG. 5, is to deposit the superconductor material and non-ferromagnetic metal simultaneously, in a single step. Simultaneous deposition may also be referred to as "co-deposition". Simultaneous deposition results in a structure as illustrated in FIG. 5, in which particles 515 of non-ferromagnetic metal are embedded throughout a continuous layer of superconductor material 514 on a semiconductor component 512. For example, a solid sol comprising the superconductor material as the continuous phase and the non-ferromagnetic metal as the dispersed phase may be formed. Similar to the FIGS. 3 and 4 examples, the amount of non-ferromagnetic metal may be selected to correspond to less than a complete monolayer of the non-ferromagnetic metal.

As an alternative to co-deposition, alternating continuous and discontinuous layers may be deposited, as in the sandwich structure described above.

Deposition processes during the manufacture of semiconductor-superconductor hybrid devices are typically performed at or below room temperature (25° C.). Alloys generally do not form under these conditions, even where co-deposition is performed.

Typically, the superconductor material is a light superconductor material and the non-ferromagnetic metal is a heavy metal. It is believed that pairing a light superconductor material with a heavy non-ferromagnetic metal may increase the spin-orbit scattering rate.

As used herein, the term "light superconductor material" refers to a superconductor material selected from lithium, beryllium, aluminium, titanium, vanadium, chromium, zinc, and gallium. Preferably, the light superconductor material is aluminium or vanadium, with aluminium being particularly preferred.

A heavy metal is a metal having an atomic number z greater than or equal to 40, and optionally greater than or equal to 57. Without wishing to be bound by theory, it is believed that the heavier the element chosen as the non-ferromagnetic metal, the greater the spin-orbit scattering rate and hence the greater the increase in critical field of the semiconductor component.

The heavy metal may have an atomic number in the range 40 to 98, optionally 57 to 98. The heavy metal is typically not promethium (z=61), polonium (Z=84) or actinium (Z=89). Astatine (Z=85) and radon (Z=86) are not metals. Radioactive decay of the heavy metal is undesirable, and a relatively stable isotope of the metal is preferably used. An isotope is "relatively stable" when it is either a stable nuclide, or is a radionuclide with a half-life greater than 500 years. Relatively stable isotopes of metals with an atomic number in the range 57 to 98 are known, with the exceptions of promethium, polonium and actinium. Stable nuclides are particularly preferred.

In particular, the non-ferromagnetic metal may have an atomic number in the range 72 to 83. In other words, the non-ferromagnetic metal may be selected from hafnium, tantalum, tungsten, rhenium, osmium, iridium, platinum, gold, mercury, thallium, lead and bismuth. Preferably, the non-ferromagnetic metal may be selected from iridium, platinum, gold, mercury, thallium, lead and bismuth. More preferably, the non-ferromagnetic metal may be selected from platinum, gold, lead, bismuth, and iridium. Particularly preferably, the non-ferromagnetic metal may be platinum.

Alternatively, the non-ferromagnetic metal may be selected from zirconium, niobium, and molybdenum. For example, the non-ferromagnetic metal may be niobium.

For example, the superconductor material may be selected from aluminium and vanadium, and the non-ferromagnetic metal may be selected from platinum, gold, lead, bismuth, and iridium.

The superconductor material may be aluminium and the non-ferromagnetic metal may be platinum. The superconductor material may be aluminium, the non-ferromagnetic metal may be platinum, and the semiconductor component may comprise a material as defined in any of Formulae 1 to 4. The semiconductor component may, for example, comprise a material selected from InSb, InAs, PbTe, SnTe, PbSe, and HgTe.

The superconductor material may be vanadium and the non-ferromagnetic metal may be platinum.

The superconductor material may be aluminium and the non-ferromagnetic metal may be niobium.

Figure 6:
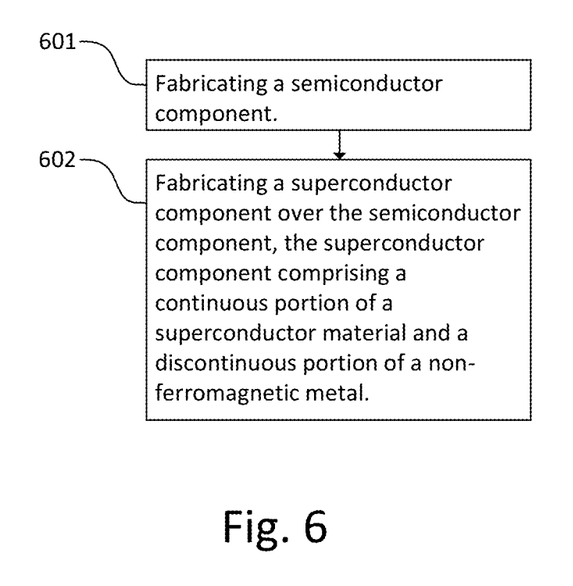
FIG. 6 is a flow chart outlining an illustrative method of fabricating a semiconductor-superconductor hybrid device.

An illustrative method of fabricating a semiconductor-superconductor hybrid device of the type illustrate in FIGS. 2a and 2b will now be explained with reference to FIG. 6. FIG. 6 is a flow chart outlining the method.

The present method includes a "pre-fabrication" phase, in which a gate electrode, gate dielectric, shadow wall and semiconductor component are arranged on a substrate. Processes involving the use of temperatures above room temperature may be used without restriction during the pre-fabrication stage. The pre-fabrication phase is followed by a fabrication phase, in which the semiconductor-superconductor hybrid structure is formed. The fabrication phase is typically performed in a vacuum chamber. It is generally desirable to minimise the exposure of the semiconductor-superconductor hybrid device to temperatures above room temperature, to avoid degrading the semiconductor-superconductor interface.

As previously described, the FIG. 2 device is bottom-gated. Fabricating a bottom-gated device includes a preliminary step of fabricating the gate electric 216 and contact pads for the gate electrode on a substrate 210. A layer of dielectric material 217 is then formed over the substrate 210 and gate electrode 216. In the present example, the layer of dielectric material 217 comprises an aluminium oxide layer, which is deposited by atomic layer deposition ("ALD").

A shadow wall 220 is then formed on the layer of dielectric material 217. The shadow wall will be used to control deposition of components during the fabrication stage. In this example, shadow wall 220 comprises a block of a silicon nitride, and is formed using plasma-enhanced chemical vapour deposition. Other techniques may be used, and other shadow wall configurations are possible.

At block 601, a semiconductor component 212 is fabricated. In this example, semiconductor component 212 is in the form of a nanowire. The nanowire is grown independently of the other components of the device, for example using the vapour-liquid-solid ("VLS") technique. The nanowire is then transferred to the substrate, and placed on top of the dielectric layer 217 over the gate electrode 216.

After placing the nanowire on the substrate, the resulting workpiece is transferred to a vacuum chamber for the fabrication phase.

In the fabrication phase, any oxide layer on the surface of the nanowire is first removed, for example by atomic hydrogen cleaning.

Then, at block 602, the superconductor component is fabricated. The superconductor component is formed using a directional deposition process from a first, fixed azimuth relative to the substrate. The azimuth is selected such that the shadow wall 220 controls the position at which material is deposited, by blocking the beam to define shadow regions in which no material is deposited. As will be appreciated, the superconductor component is deposited selectively on the semiconductor component.

Both the superconductor material and the non-ferromagnetic metal are deposited from the first azimuth, either simultaneously or sequentially. The amounts of the superconductor material and non-ferromagnetic metal to be deposited are selected such that a continuous layer of the superconductor material and a discontinuous layer of the non-ferromagnetic metal are formed. The amount of the non-ferromagnetic metal is selected to correspond to less than a monolayer of the non-ferromagnetic metal. The deposition may be monitored using a thin-film thickness monitor.

After fabricating the superconductor component, the electrical connector 218 is fabricated. Fabricating the electrical connector 218 may comprise depositing a metal from a second, fixed azimuth different from the first azimuth in order to deposit the metal selectively at a desired position. This deposition may be controlled using a shadow wall, or the nanowire may be self-shadowing, i.e. the nanowire structure itself may act as a shadow wall for controlling the position at which the metal is deposited.

After fabricating the electrical connector 218, the device may optionally be capped with a layer of a dielectric. For example, an aluminium oxide layer may be deposited by evaporation.

Various modifications to the above described method are possible. For example, in variants where the device is to be side-gated or top-gated, the semiconductor component may be grown directly on the substrate, e.g. using selective area growth.

It will be appreciated that the above embodiments have been described by way of example only.

More generally, according to one aspect disclosed herein, there is provided a semiconductor-superconductor hybrid device, comprising: a semiconductor component; and a superconductor component arranged over the semiconductor component; wherein the superconductor component comprises a continuous portion of a superconductor material and a discontinuous portion of a non-ferromagnetic metal; and wherein the discontinuous portion is configured to increase the critical field of the superconductor component. It has surprisingly been found that adding a discontinuous portion of a non-ferromagnetic metal to a continuous portion of superconductor material may increase the critical field of the superconductor component. This may allow the semiconductor-superconductor hybrid device to be operated in a stronger magnetic field, which may in turn allow for an increased topological gap.

The superconductor compound may be arranged directly on the semiconductor component. Alternatively, a further component such as a ferromagnetic insulator component may be arranged between the semiconductor component and the superconductor component.

The discontinuous portion increase the critical field relative to a comparative device which lacks the discontinuous portion but is otherwise identical. Conditions other than magnetic field strength are kept constant for the comparison.

The discontinuous portion may be present in any part of the superconductor component.

The discontinuous portion may be arranged on a surface of the continuous portion. For example, the continuous portion is arranged between the semiconductor component and the discontinuous portion. Alternatively, the discontinuous portion may be distributed throughout the continuous portion. In accordance with a still further possibility, the superconductor component may comprise two continuous portions, and the discontinuous portion may be arranged between the continuous portions.

The superconductor material may be a light superconductor. In particular, the superconductor material may be selected from aluminium and vanadium. Aluminium is particularly preferred. Using a light superconductor as the continuous portion may increase the magnitude of the effect of the discontinuous portion.

In implementations where aluminium is used as the superconductor material, the continuous portion may be in the form of a layer having a thickness greater than or equal to 10 nm, for example, in the range 10 to 50 nm, or 15 to 25 nm. Since the discontinuous portion increases the critical field of the superconductor component, layer thicknesses may be increased.

The non-ferromagnetic metal may be a heavy metal, as defined above. Examples of heavy metals include tantalum, tungsten, rhenium, osmium, iridium, platinum, gold, mercury, thallium, lead, and bismuth. In particular, the non-ferromagnetic metal may be selected from iridium, platinum, gold, mercury, thallium, lead, and bismuth. Particularly preferably, the non-ferromagnetic metal may be platinum. Using a heavy metal as the non-ferromagnetic metal may provide a greater increase in critical field.

The semiconductor component may comprise a material of Formula 1:

$$InAs_xSb_{(1-x)} \quad \text{(Formula I)}$$

where x is in the range 0 to 1. For example, the semiconductor component may comprise indium antimonide. Materials in this class may have good compatibility with superconductor materials such as aluminium. Values of x in the range 0.35 to 0.8 may provide particular advantages for some implementations.

Alternatively, the semiconductor component may comprise a material of any of Formulae 2, 3, and 4 as defined hereinabove.

The semiconductor material may, for example, be selected from: InAs, PbTe, SnTe, PbSe, and HgTe.

The discontinuous portion may be obtainable by depositing the non-ferromagnetic metal in an amount corresponding to less than a monolayer of the non-ferromagnetic metal. For example, the discontinuous portion may be obtainable by monitoring the nominal thickness of a layer of the non-ferromagnetic metal during deposition using a thin-film thickness monitor or deposition rate controller; and stopping the deposition before the nominal thickness reaches the thickness of a monolayer of the non-ferromagnetic metal. The deposition may be stopped when the nominal thickness reaches a value in the range of 20% to 80%, optionally 40% to 60%, of the thickness of a monolayer of the non-ferromagnetic metal.

In examples where the non-ferromagnetic metal is platinum, the deposition may be stopped when the nominal thickness of the platinum is less than 0.4 nm, optionally 0.2±0.05 nm. Layers with nominal thicknesses within the stated ranges will be discontinuous.

Also provided is a quantum computer device, such as a qubit device, comprising a semiconductor-superconductor hybrid device as defined hereinabove.

Another aspect provides a method of fabricating a semiconductor-superconductor hybrid device, which method comprises: fabricating a semiconductor component; and fabricating a superconductor component over the semiconductor component; wherein the superconductor component comprises a continuous portion of a superconductor material and a discontinuous portion of a non-ferromagnetic metal; and wherein the discontinuous portion is configured to increase the critical field of the superconductor component.

As will be appreciated, the various features described above with reference to the device aspect are also applicable to the method aspect.

Fabricating the superconductor component may comprise: depositing the superconductor material in an amount selected to form a continuous layer of the superconductor material; and depositing the non-ferromagnetic metal in an amount selected to form less than a monolayer of the non-ferromagnetic metal.

The superconductor material may be deposited before or after the non-ferromagnetic metal. Alternatively, the continuous portion and the discontinuous portion may be fabricated by co-depositing the superconductor material and the non-ferromagnetic metal. The depositing may comprise a directional deposition process.

Depositing the non-ferromagnetic metal may comprise monitoring the amount of non-ferromagnetic metal deposited, and stopping the deposition before the amount reaches the amount of non-ferromagnetic metal which would form a monolayer. The monitoring may comprise using a thin-film thickness monitor or deposition rate controller.

For example, the amount of the non-ferromagnetic metal may be selected to be 20 to 80% by mass of the mass of a monolayer of the non-ferromagnetic material.

A still further aspect provides the use of a non-ferromagnetic metal to increase the critical field of a superconductor component of a semiconductor-superconductor hybrid device, wherein the non-ferromagnetic metal is present in the superconductor component in the form of a discontinuous portion arranged on or in a continuous portion of a superconductor material.

The non-ferromagnetic metal may be a heavy metal, as defined hereinabove. In particular, the non-ferromagnetic metal may be selected from iridium, platinum, gold, mercury, thallium, lead, and bismuth. Preferably, the non-ferromagnetic metal is platinum.

The superconductor material may be a light superconductor material, as defined hereinabove. In particular, the superconductor material may be aluminium or vanadium.

EXAMPLES

Example 1

Figure 7:
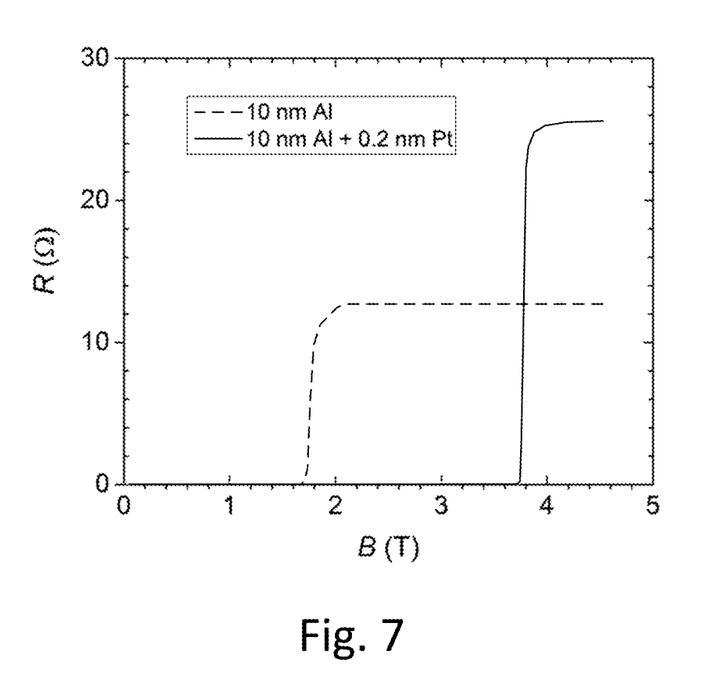
FIG. 7 is a plot comparing the resistances of an aluminium layer and an aluminium layer provided with a discontinuous coating of platinum as a function of applied magnetic field strength.

FIG. 7 shows a plot of resistance against applied magnetic field strength for two different superconductor components at a constant temperature.

The first superconductor component is a 10 nm thick layer of aluminium. At an applied magnetic field B of 0 T, the first superconductor component has a resistance of 0Ω. Increasing the magnetic field strength to roughly 1.5 T has no effect on the resistance of the superconductor component. However, once the magnetic field strength reaches just over 1.6 T, an abrupt increase in the resistance of the superconductor component is observed. This illustrates that superconductive behaviour is lost when the applied magnetic field exceeds the critical field limit of the component.

The superconductor component is a 10 nm thick layer of aluminium coated with a layer of platinum having a nominal thickness of 0.2 nm. The minimum thickness of a monolayer of platinum is in the range of 0.4 to 0.5 nm. Thus, the platinum layer in this example forms less than a monolayer, and is a discontinuous portion of platinum.

As shown in FIG. 7, the second superconductor component maintains its superconductive behaviour until the applied magnetic field exceeds about 3.6T. This illustrates that, by providing a superconductor component with a discontinuous portion of a non-ferromagnetic metal, the critical field of the superconductor component may be increased.

Example 2

A comparative semiconductor-superconductor hybrid device and an example semiconductor-superconductor hybrid device according to the present disclosure were fabricated using a method of the type described in PCT/US2019/18284. Each device had the general structure illustrated in FIGS. 2a and 2b. The superconductor component of the comparative device was an aluminium layer. The superconductor component of the device according to the present disclosure included an aluminium layer and a discontinuous portion comprising platinum. The semiconductor component of each device was an indium antimonide nanowire.

In outline, the fabrication comprised forming a gate electrode and a shadow wall structure over a substrate, transferring a semiconductor nanowire to the substrate, and depositing superconductor material by directional deposition from an acute angle relative to the substrate such that the shadow wall casted a shadow in the deposition leaving areas where the superconductor material was not deposited. The shadow wall structure included defined gaps for controlling deposition of the electrical connectors. The configuration of the shadow wall allowed the superconductor component and electrical connectors to be deposited in a single step, thereby avoiding additional fabrication steps after forming the semiconductor-superconductor interface.

Figure 8A:
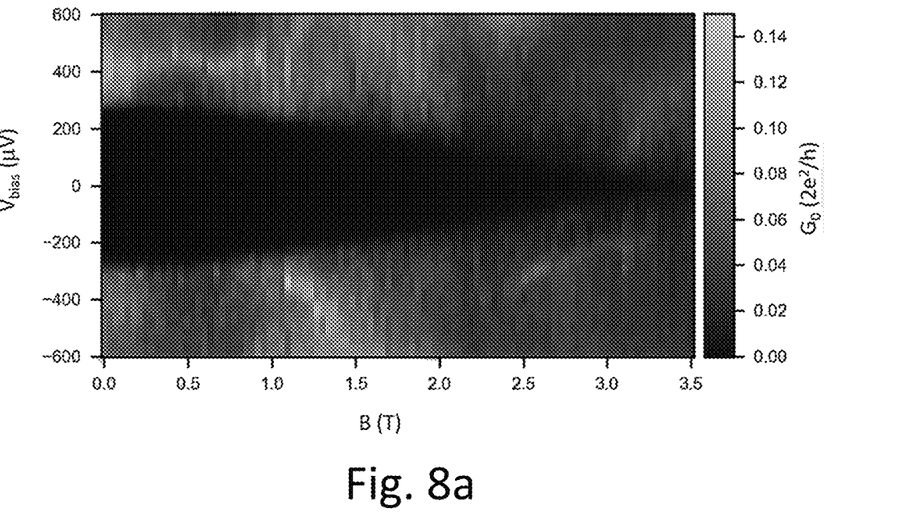
FIG. 8a is a heat map of G as a function of applied voltage and magnetic field for a semiconductor-superconductor hybrid device in which the superconductor component is an aluminium layer.
Figure 8B:
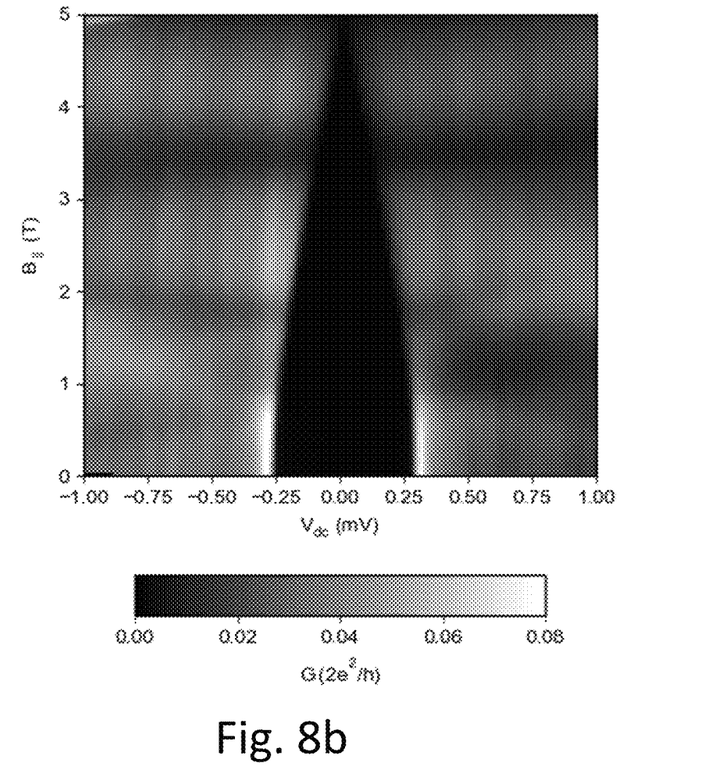
FIG. 8b is a heat map of G as a function of applied voltage and magnetic field for a semiconductor-superconductor hybrid device in which the superconductor component is an aluminium layer having a discontinuous coating of platinum.

FIGS. 8a and 8b illustrate the effects of an applied magnetic field on superconductor gap in the two devices. The superconductor gap is an indication of the energy gained by two electrons when a Cooper pair is formed.

FIG. 8a shows data for the comparative device. At an applied magnetic field of 0 T, a superconductor gap is observed. Applying a magnetic field causes the superconductor gap to shrink.

FIG. 8b shows data for the example device according to the present disclosure. The figure illustrates that a superconductor gap is maintained at higher magnetic field strengths compared to the case shown in FIG. 8a.

These results illustrate that, by providing a discontinuous portion of a non-ferromagnetic metal in a superconductor component of a semiconductor-superconductor hybrid device, it may be made possible to operate the device at higher applied magnetic fields.

Other variants or use cases of the disclosed techniques may become apparent to the person skilled in the art once given the disclosure herein. The scope of the disclosure is not limited by the described embodiments but only by the accompanying claims.

The invention claimed is:

1. A semiconductor-superconductor hybrid device, comprising:
   a semiconductor component; and
   a superconductor component arranged over the semiconductor component;
   wherein the superconductor component comprises a continuous portion of a superconductor material and a discontinuous portion of a non-ferromagnetic metal, the superconductor material and non-ferromagnetic metal being co-deposited;
   wherein the discontinuous portion is configured to increase the critical field of the superconductor component.

2. The semiconductor-superconductor hybrid device according to claim 1, wherein the discontinuous portion is arranged on a surface of the continuous portion.

3. The semiconductor-superconductor hybrid device according to claim 2, wherein the continuous portion is arranged between the semiconductor component and the discontinuous portion.

4. The semiconductor-superconductor hybrid device according to claim 1, wherein the discontinuous portion is distributed throughout the continuous portion.

5. The semiconductor-superconductor hybrid device according to claim 1, wherein the superconductor component comprises two continuous portions, and wherein the discontinuous portion is arranged between the continuous portions.

6. The semiconductor-superconductor hybrid device according to claim 1, wherein the superconductor material is selected from aluminium and vanadium.

7. The semiconductor-superconductor hybrid device according to claim 1, wherein the non-ferromagnetic metal is selected from tantalum, tungsten, rhenium, osmium, iridium, platinum, gold, mercury, thallium, lead, and bismuth.

8. The semiconductor-superconductor hybrid device according to claim 6, wherein the non-ferromagnetic metal is platinum.

9. The semiconductor-superconductor hybrid device according to claim 1, wherein the semiconductor component comprises a material of Formula 1:

$$InAs_xSb_{(1-x)} \quad \text{(Formula 1)}$$

where x is in the range 0 to 1.

10. The semiconductor-superconductor hybrid device according to claim 1, wherein the discontinuous portion is an island of a submonolayer obtainable by depositing the non-ferromagnetic metal in an amount corresponding to less than an amount required to form a monolayer of the non-ferromagnetic metal.

11. A method of fabricating a semiconductor-superconductor hybrid device, which method comprises:
fabricating a semiconductor component; and
fabricating a superconductor component over the semiconductor component;
wherein the superconductor component comprises a continuous portion of a superconductor material and a discontinuous portion of a non-ferromagnetic metal;
wherein the discontinuous portion is configured to increase the critical field of the superconductor component; and
wherein the continuous portion and the discontinuous portion are fabricated by co-depositing the superconductor material and the non-ferromagnetic metal.

12. The method according to claim 11, wherein fabricating the superconductor component comprises:
depositing the superconductor material in an amount selected to form a continuous layer of the superconductor material; and
depositing the non-ferromagnetic metal in an amount selected to form one or more islands of a submonolayer of the non-ferromagnetic metal.

13. The method according to claim 12, wherein the amount of the non-ferromagnetic metal is selected to be 20 to 80% by mass of the mass of a monolayer of the non-ferromagnetic material.

14. The method according to claim 11, wherein the superconductor material is selected from aluminium and vanadium.

15. The method according to claim 11, wherein the non-ferromagnetic metal is selected from tantalum, tungsten, rhenium, osmium, iridium, platinum, gold, mercury, thallium, lead, and bismuth.

16. The method according to claim 15, wherein the non-ferromagnetic metal is selected from iridium, platinum, gold, mercury, thallium, lead, and bismuth.

17. The method according to claim 14, wherein the non-ferromagnetic metal is platinum.

18. The method according to claim 11, wherein the semiconductor component comprises a material of Formula 1:

$$InAs_xSb_{(1-x)} \quad (\text{Formula 1})$$

where x is in the range 0 to 1.

19. The method according to claim 18, wherein the semiconductor component comprises indium antimonide.

* * * * *